US008731099B2

(12) United States Patent
Giannini et al.

(10) Patent No.: US 8,731,099 B2
(45) Date of Patent: May 20, 2014

(54) WIRELESS TRANSMITTERS

(75) Inventors: Vito Giannini, Leuven (BE); Tomohiro Sano, Itami (JP); Mark Ingels, Boutersem (BE); Jan Craninckx, Boutersem (BE)

(73) Assignees: IMEC, Leuven (BE); Renesas Electronics Corporation, Tokyo (JP)

( * ) Notice: Subject to any disclaimer, the term of this patent is extended or adjusted under 35 U.S.C. 154(b) by 351 days.

(21) Appl. No.: 13/230,614

(22) Filed: Sep. 12, 2011

(65) Prior Publication Data

US 2012/0063496 A1  Mar. 15, 2012

Related U.S. Application Data

(60) Provisional application No. 61/382,292, filed on Sep. 13, 2010.

(30) Foreign Application Priority Data

Dec. 20, 2010  (EP) .................................... 10195986
Jan. 19, 2011  (EP) .................................... 11151393

(51) Int. Cl.
*H04B 1/02* (2006.01)

(52) U.S. Cl.
USPC .......................................... 375/295; 455/91

(58) Field of Classification Search
USPC ......... 375/219, 221, 222, 259, 295–297, 308; 455/73, 84, 85, 91, 114.3
See application file for complete search history.

(56) References Cited

U.S. PATENT DOCUMENTS

2005/0116850 A1*  6/2005  Hezar et al. ................... 341/143
2005/0162222 A1*  7/2005  Hezar et al. ................... 330/10
2006/0044057 A1*  3/2006  Hezar et al. ................... 330/10
2010/0022215 A1   1/2010  Ganger et al.
2011/0050471 A1*  3/2011  Kumar ........................... 341/143

FOREIGN PATENT DOCUMENTS

WO  WO2009/012661  10/2009
WO  WO2010/025556   3/2010
WO  WO2010/034834   4/2010

OTHER PUBLICATIONS

European Search Report, European Patent Application No. 11151393.3 dated Aug. 17, 2011.
He, Xin et al., "A Low-Power, Low-EVM, SAW-Less WCDMA Transmitter Using Direct Quadrature Voltage Modulation", IEEE Journal of Solid-State Circuits, vol. 44, No. 12, Dec. 2009, pp. 3448-3458.

(Continued)

*Primary Examiner* — Young T. Tse
(74) *Attorney, Agent, or Firm* — McDonnell Boehnen Hulbert & Berghoff LLP

(57) ABSTRACT

Transmitter circuits for generating baseband signals having low receiver-band noise are disclosed. In one embodiment, the transmitter circuit comprises an active filtering-and-amplifying component comprising a first input configured to receive a first input signal, and a first output configured to output a first output signal. The transmitter circuit further comprises a passive filtering component comprising a second input connected to the first output and configured to receive the first output signal, a passive pole arrangement comprising a number of switchable resistance elements and a capacitance element connected across the plurality of switchable resistance elements, and a second output configured to output a second output signal having reduced noise as compared to the first output signal. The transmitter still further comprises a number of feedback loops connecting the passive filtering component to the first input.

20 Claims, 7 Drawing Sheets

(56) References Cited

OTHER PUBLICATIONS

Cassia, Marco et al., "A Low-Power CMOS SAW-Less Quad Band WCDMA/HSPA/HSPA+/1x/EGPRS Transmitter", IEEE Journal of Solid-State Circuits, vol. 44, No. 7, Jul. 2009, pp. 1897-1906.

Ingels, Mark et al., "A 5mm2 40nm LP CMOS 0.1-to-3GHz Multistandard Transceiver", ISSCC 2010, Session 25, Wireless Connectivity, 25.5, pp. 458-460.

Jones, Christopher et al., "Direct-Converion WCDMA Transmitter with −163dBc/Hz Noise at 190 MHz Offset", ISSCC 2007, Session 19, Cellular and Multi-Mode Transceivers, 19.1, pp. 336-338.

Mirzaei, Ahmad et al., "A Low-Power WCDMA Transmitter With an Integrated Notch Filter", IEEE Journal of Solid-State Circuits, vol. 43, No. 12, Dec. 2008,pp. 2868-2881.

He, Xin et al., "A 45nm WCDMA Transmitter Using Direct Quadrature Voltage Modulator With High Oversampling Digital Front-End", ISSCC 2010, Session 3, Cellular Techniques, 3.4, pp. 62-64.

"3rd Generation Partnership Project: Technical Specification Group Radio Access Network; Evolved Universal Terrestrial Radio Access (E-UTRA); User Equipment (UE) Radio Transmission and Reception (Release 8)", 3GPP TS 36.101, V8.6.0, Jun. 2009, pp. 1-143.

Lee, Kang-Yoon et al., "Full-CMOS 2-GHz WCDMA Direct Conversion Transmitter and Receiver", IEEE Journal of Solid-State circuits, vol. 38, No. 1, Jan. 2003, pp. 43-53.

Heping, Ma et al., "A Multi-Standard Active-RC Filter With Accurate Tuning System", Journal of Semiconductors, vol. 30, No. 9, Sep. 2009, pp. 095011-1-095011-4.

Hausmann, Kurt, et al., "A SAW-less CMOS TX for EGPRS and WCDMA", 2010 IEEE Radio Frequency Integrated Circuits Symposium (RFIC), pp. 25-28, May 2010.

\* cited by examiner

WIRELESS TRANSMITTERS

CROSS-REFERENCE TO RELATED APPLICATIONS

This application is a non-provisional of U.S. Provisional Patent Application Ser. No. 61/382,292 filed Sep. 13, 2010, the contents of which are hereby incorporated by reference. Further, this application claims priority to European Patent Application Serial Nos. EP 10195986.4 filed Dec. 20, 2010 and EP 11151393.3 filed Jan. 29, 2011, the contents of each of which are hereby incorporated by reference.

BACKGROUND

Wireless communications systems may be generally categorised into frequency division duplexing (FDD) systems and time division duplexing (TDD) systems. In FDD systems, the transmitter and receiver typically operate simultaneously but at different frequencies, and the duplexer provides isolation between them. Due to the finite duplexer transmitter-receiver isolation, out-of-band noise present in the transmitter is especially critical, as it may leak into the receiver band and irreparably corrupt the sensitivity of the receiver. Far-out-of-band noise is an important concern in transmitting devices, especially when they coexist with, for example, Global Positioning System (GPS), Wireless Local Area Network (WLAN) and/or Worldwide Interoperability for Microwave Access (WiMAX) components on the same smartphone.

Typically, an inter-stage Surface Acoustic Wave (SAW) filter is added to suppress this transmitter leakage. In particular, an inter-stage SAW filter may be included for every band between Pre-Power Amplifier (PPA) and Power Amplifier (PA). However, this severely increases the cost of materials required and the footprint of the overall device.

When Carrier-to-Noise (CNR) values at different receiver frequency offset are lower than, for example, −160 dBc/Hz at the PPA output (which may be an example of a worst-case value), it is possible to remove the inter-stage SAW. A conventional voltage-sampling mixing transmitter is described in an article by M. Ingels, V. Giannini, J. Borremans, et al., entitled "A 5 mm$^2$ 40 nm LP CMOS 0.1-to-3 GHz Multistandard Transceiver", ISSCC Dig. Tech. Papers, pp. 458-459, February 2010. As taught by Ingels et al., an active filter is needed to remove the Digital-to-Analogue Conversion (DAC) aliases to reconstruct the wanted signal. Furthermore, a passive pole is still needed to further reduce the out-of-band noise before a voltage-sampling mixer up-converts the signal to radio frequency (RF).

However, by introducing such passive pole, several issues will arise. First, the passive mixing operation will suffer increased gain losses, resulting in a reduction of P1 dB over the RF frequency. Second, because the passive pole is a fixed passive pole, there are no trade-offs available in the case that different receiver FDD frequency offsets are to be targeted. Third, as the passive pole introduces noise by itself too, different trade-offs might be needed when the target channel bandwidths are different.

In "A Low-Power, Low-EVM, SAW-Less WCDMA Transmitter Using Direct Quadrature Voltage Modulation" by Xin He and Jan van Sinderen, IEEE J. Solid-State Circuits, Vol. 44, No. 12, December 2009, a transmitter is described that uses direct quadrature voltage modulation. The core of the modulator is a passive voltage mixer driven by a 25% duty-cycle local oscillator, which provides significantly improved performance in terms of output noise, linearity, Local Oscillator (LO) leakage, Error Vector Magnitude (EVM) and power consumption in the transmitter. Here, the requirement to accommodate standard diversities among different countries and different operation service providers is noted in that next generation mobile handsets will need to support up to 10 Wideband Code Division Multiple Access (WCDMA) bands (Bands I, II, III, IV, V, VI, VIII, IX, X and XI), 4 Global System for Mobile communications (GSM)/Enhanced Data rates for GSM Evolution (EDGE) bands (Bands GSM850, EGMS900, DCS1800 and PCS1900), as well as the emerging standard Long Term Evolution (LTE).

One of the key challenges to the elimination of SAW filters between the transmitter and the PA is to achieve a low transmitter noise floor without sacrificing power consumption. A new passive voltage mixer is described that leads to improved performance in terms of power consumption, noise floor, linearity, LO leakage and EVM. The direct quadrature voltage modulator consists of a Low Pass Filter (LPF), mixer and PA driver. The LPF attenuates the far-out noise at the proceeding Intermediate Frequency (IF) input and also suppresses the aliases from the DAC. By switching on/off four transistors through the quadrature-phased LO with the 25% duty-cycle, the filtered IF quadrature input voltages are sequentially sampled to the voltage mixer output which sees the high input impedance of the PA driver. Due to the high input impedance of the PA driver that employs a cascode structure, the linearity of the voltage mixer is not degraded.

However, due to the 25% duty-cycle LO waveforms, the slope of the rising edges and the falling edges cannot be infinite. The switch-on and switch-off time in the mixer switches cannot be zero. These effects result in a short overlapping period during the transition between just turning off one transistor and just turning on the next which degrades the linearity of the passive voltage mixer.

The out-of-band noise problem has been extensively analysed for the most popular WCDMA bands (I, II, V). Complementary metal-oxide-semiconductor (CMOS) transmitters with receiver band CNR down to −160 dBc/Hz, as described above, are typically power hungry, and as a result typically also involve the replacement of high-voltage Gilbert mixers (e.g., as described by M. Cassia et al. in "A Low-Power CMOS SAW-Less Quad Band WCDMA/HSPA/HSPA+/1X/EGPRS Transmitter", IEEE. J. Solid-State Circuits, vol. 44, no. 7, pp 1897-1906, July 2009, and by C Jones et al. in "Direct-Conversion WCDMA Transmitter with 163 dBc/Hz Noise at 190 MHz Offset", ISSCC Dig. Tech. Papers, pp. 336-607, February 2007).

Feedback-based notching techniques, as described by A. Mirzaei and H. Darabi in "A Low-Power WCDMA Transmitter with an Integrated Notch Filter", IEEE J. Solid-State Circuits, vol. 43, no. 12, pp. 2868-2881, December 2008, might impact the achievable output power when wider bandwidths and low transmitter-receiver offsets are required.

A direct quadrature voltage modulator has been proposed in an article by Xin He, Jan van Sinderen and Robert Rutten, entitled "A 45 nm WCDMA Transmitter Using Direct Quadrature Voltage Modulator with High Oversampling Digital Front-End", ISSCC Dig. of Tech. Papers, pp. 62-63, February 2010. A highly digitised multimode transmitter is described in which a Direct Quadrature Voltage Modulator (DQVM) incorporates a high speed DAC and Digital Front-End (DFE) with high oversampling ratio capable of multimode operation by adapting the sampling data rate. In the DFE, the serial I/Q baseband inputs are first converted to parallel 10-bit or 12-bit I/Q data and then are up-sampled to 32 times the input data rate before being fed into the DAC. This up-conversion technique uses the combination of an RC pole and passive mixer to achieve both linearity and low out-of-band noise. However, losses in such a mixer are proportional to the resistor value and, especially at high carrier frequencies, they shift the linearity requirements to the baseband driving stage such that large linear signal swings must be provided on a low impedance node.

In the architecture described, a simple passive low-pass filter (LPF) after the DAC is sufficient to suppress the sampling images with the help of a high oversampling ratio. The advantage of using a high oversampling ratio in the DFE rather than an active LPF after the DAC is that the power and the area can be reduced with CMOS scaling. The I/Q matching is also improved. Moreover, it can be easily adapted to different standards by using different sampling clock frequency and bypass mode settings.

The challenge of SAW-less receiver band noise becomes more acute in the LTE standard (3GPP TS 36.101, "Evolved Universal Terrestrial Radio Access (LTE): User Equipment (UE) Radio Transmission and Reception", v. 8.6.0, June 2009) where transmitters are needed to operate in multiple FDD bands using wider channel bandwidths and higher Peak-to-Average Power Ratios (PAPR).

SUMMARY

The present disclosure is generally directed to wireless transmitters, in particular those utilising a SAW-less transmitter architecture. The disclosed transmitters are multi-standard transmitters and use passive pole filtering.

In one aspect, a transmitter circuit is disclosed. The transmitter circuit comprises an active filtering-and-amplifying component comprising a first input configured to receive a first input signal, and a first output configured to output a first output signal. The transmitter circuit further comprises a passive filtering component comprising a second input connected to the first output and configured to receive the first output signal, a passive pole arrangement comprising a number of switchable resistance elements and a capacitance element connected across the plurality of switchable resistance elements, and a second output configured to output a second output signal having reduced noise as compared to the first output signal. The transmitter still further comprises a number of feedback loops connecting the passive filtering component to the first input.

In some embodiments, the transmitter circuit may suppress noise generated by the active filtering-and-amplifying component using the passive filtering component by feeding back a signal generated by the passive filtering component to the input of the active filtering-and-amplifying component.

Further, in some embodiments, the resistance elements in the passive filtering component may form a passive pole arrangement with a capacitance element connected across the resistance elements.

Still further, in some embodiments the passive pole arrangement may comprise an array of switchable resistance elements, the capacitance element being connected across all switchable resistance elements in the array to form the passive pole arrangement with active resistance elements. Here, the passive pole arrangement becomes variable as the resistance elements are switched in accordance with the values required. In this way, the filtering is flexible due to the use of switchable resistors inside a feedback loop of an amplifier or an active filtering stage.

In some embodiments, each feedback loop resistance element may also comprise a switchable resistance element. Each switchable resistance element may comprise a switch element and at least one resistance element.

Further, in some embodiments, the transmitter circuit may form part of a transceiver circuit with substantially reduced out-of-band noise in the receiver circuit thereof. For example, the transceiver circuit may be formed as an integrated circuit together with other components necessary for the operation of the transceiver.

In another aspect of the present disclosure, a transceiver is disclosed. The transceiver may include a number of transmitter circuits similar to the transmitter circuit described above.

In still another aspect of the present disclosure, an integrated circuit is disclosed. The integrated circuit may include a transceiver similar to the transceiver described above. The transceiver may be implemented in complementary metal-oxide-semiconductor (CMOS) technology.

In some embodiments, the active filtering-and-amplifying component comprises a plurality of active filtering-and-amplifying component connected in series with each other. Further, the at least one passive filtering means is connected via the at least one feedback loop with the input of the previous active filtering means of the plurality of active filtering means.

Further, in some embodiments, the at least one passive filtering means further comprises an array of capacitors that together with the flexible resistor provides noise filtering and bandwidth control.

Still further, in some embodiments, the passive filtering means comprises a plurality of flexible resistors switchably connected to the output of the first filtering means.

In yet another aspect of the present disclosure, a method for generating an amplified baseband signal having low receiver-band noise is disclosed. The method comprises generating a first filtered baseband of an input signal by means of an active filtering/amplifier, suppressing noise in the first filtered baseband signal by means of at least one passive filtering means, and removing or reducing the non-linearity of the at least one flexible resistor by providing at least one feedback loop connecting the at least one passive filtering means to the input of the active filtering/amplifier.

BRIEF DESCRIPTION OF THE DRAWINGS

For a better understanding of the present disclosure, reference will now be made, by way of example only, to the accompanying drawings, in which.

DETAILED DESCRIPTION

Figure 1:
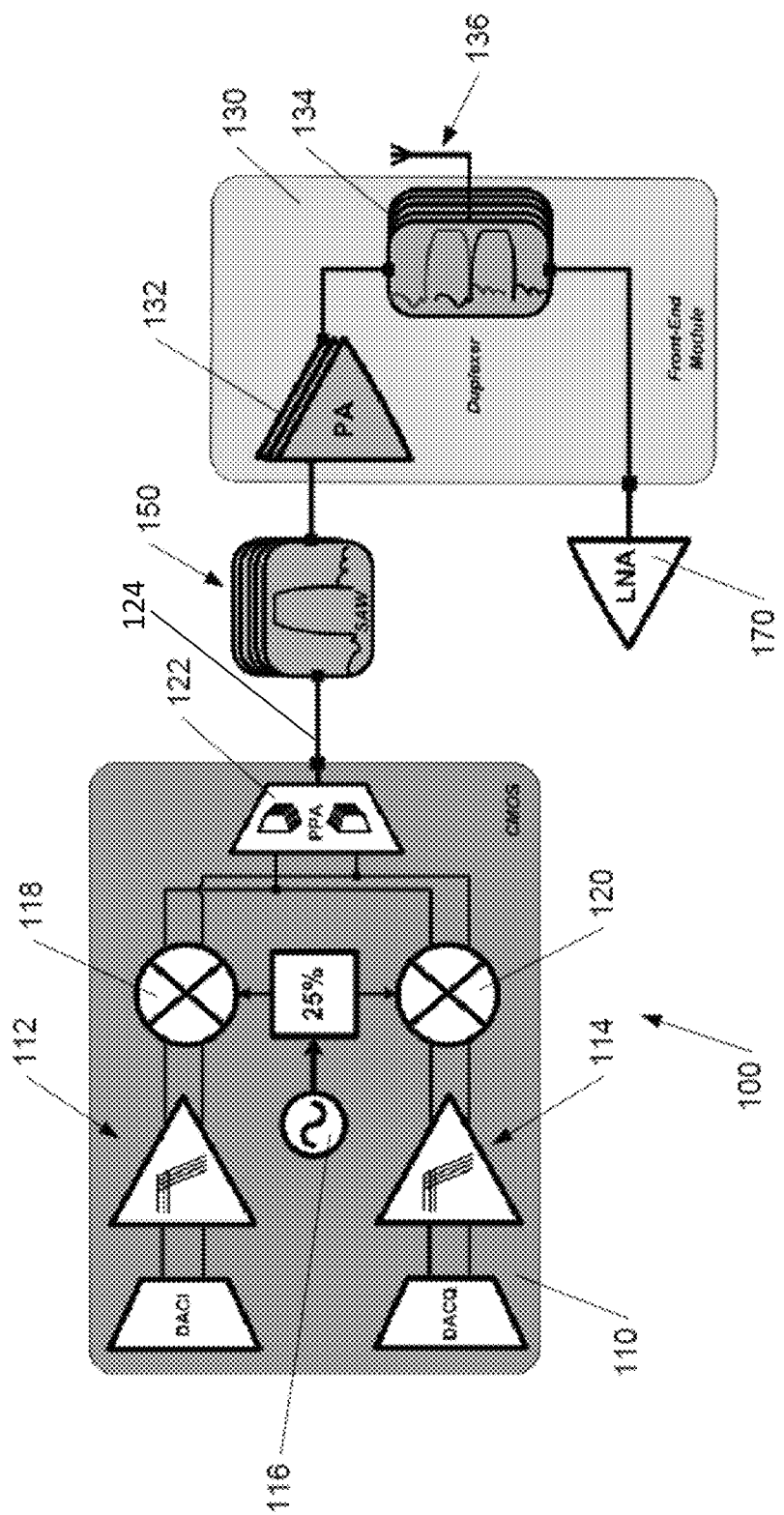
FIG. 1 illustrates a block diagram of a typical transceiver arrangement.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

FIG. 1 illustrates a block diagram of a typical transceiver arrangement. In particular, FIG. 1 shows a transceiver 100 in which an inter-stage surface acoustic wave (SAW) filter has been added to suppress transmitter leakage, as discussed above. The transceiver 100 comprises a transmitter stage 110 and a front-end module 130 connected by means of a SAW filter 150. The front-end module 130 includes a power amplifier (PA) 132, a duplexer 134, and an antenna 136. As shown, the antenna 136 is connected to the duplexer 134 so that the transmitter and receiver functions of the transceiver 100 can be interleaved in an appropriate manner. The duplexer 134 is also connected to a low noise amplifier (LNA) 170 that forms an input to a receiver stage (not shown).

The transmitter stage 110 comprises baseband channels as indicated by arrows 112, 114 that are mixed with signals from a local oscillator (LO) 116 in respective mixers 118, 120 prior to being amplified in a pre-power amplifier (PPA) 122. The LO 116 operates on a 25% duty cycle. Output signals 124 from the PPA 122 form the input to the SAW filter 150.

The transmitter stage 110 can be implemented using complementary metal-oxide-semiconductor (CMOS) technology on a single integrated circuit.

As shown in FIG. 1, the SAW filter 150 effectively comprises a bank of filter elements, where each filter element is required for a particular frequency band. The PA 132 and duplexer 134 each also comprise a bank of elements that are designated for particular frequency bands.

Figure 2:
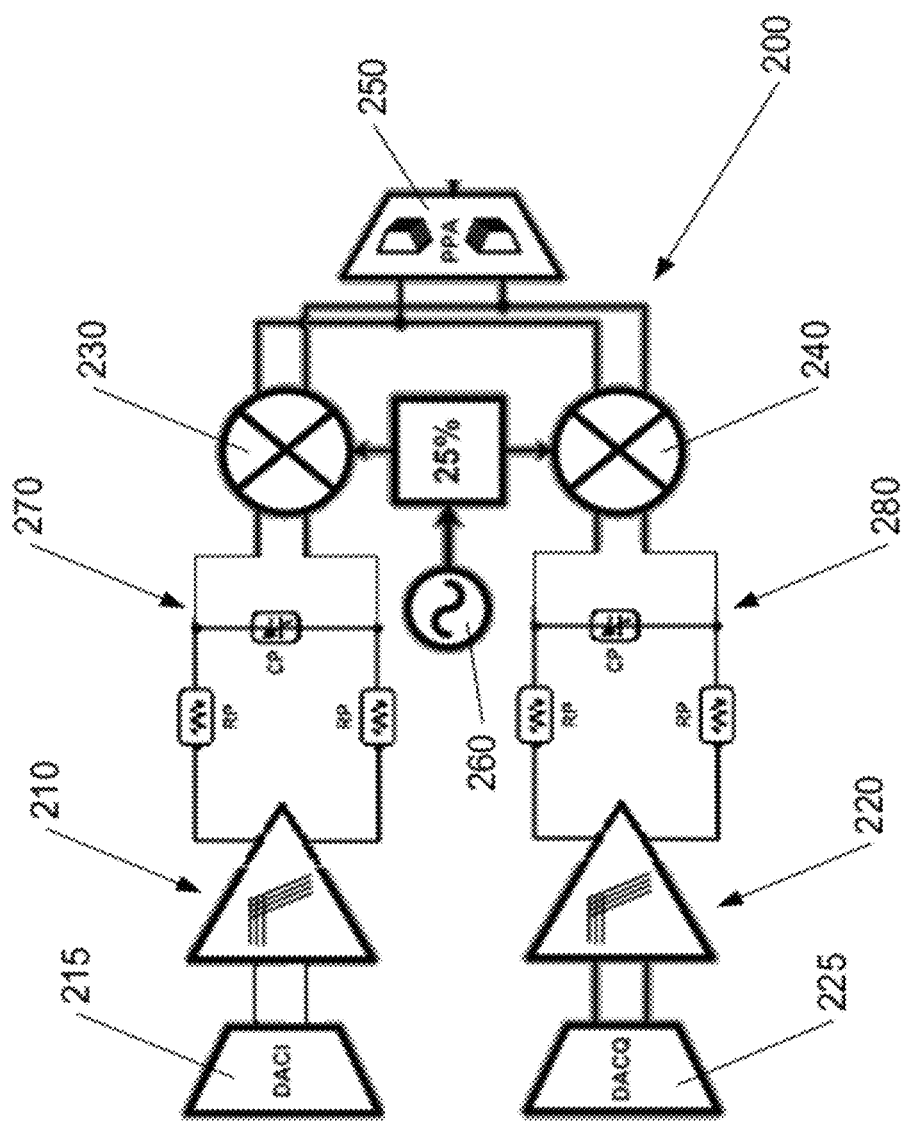
FIG. 2 illustrates a block diagram of a typical transmitter.

FIG. 2 illustrates a block diagram of a typical transmitter. In particular, in FIG. 2, a conventional voltage-sampling mixing transmitter 200 is shown. Such a transmitter is described in the article entitled "A 5 mm$^2$ 40 nm LP CMOS 0.1-to-3 GHz Multistandard Transceiver" discussed above. The transmitter 200 comprises baseband channels 210, 220 that feed mixers 230, 240 prior to being passed to a PPA 250. A LO 260 supplies mixing signals for the mixers 230, 240 as shown on a 25% duty cycle.

In addition, a passive pole (resistance pole-capacitance pole) 270 is located in the baseband channel 210 between a digital-to-analogue converter (DACI) 215 and the mixer 230. Similarly, in the baseband channel 220, an identical passive pole 280 is located between a digital-to-analogue converter (DACQ) 225 and the mixer 240.

However, as discussed above, there are disadvantages with introducing such passive poles. Gain losses are increased and there are no trade-offs in different frequency offsets. In addition, the passive pole itself introduces noise.

The present disclosure relates to a wireless (multi-standard) transmitter core that uses flexible passive pole filtering. The flexibility is provided by a switchable resistance element inside a feedback loop of an amplifier or active filtering stage. The principle of operation is described with reference to FIG. 3.

Figure 3:
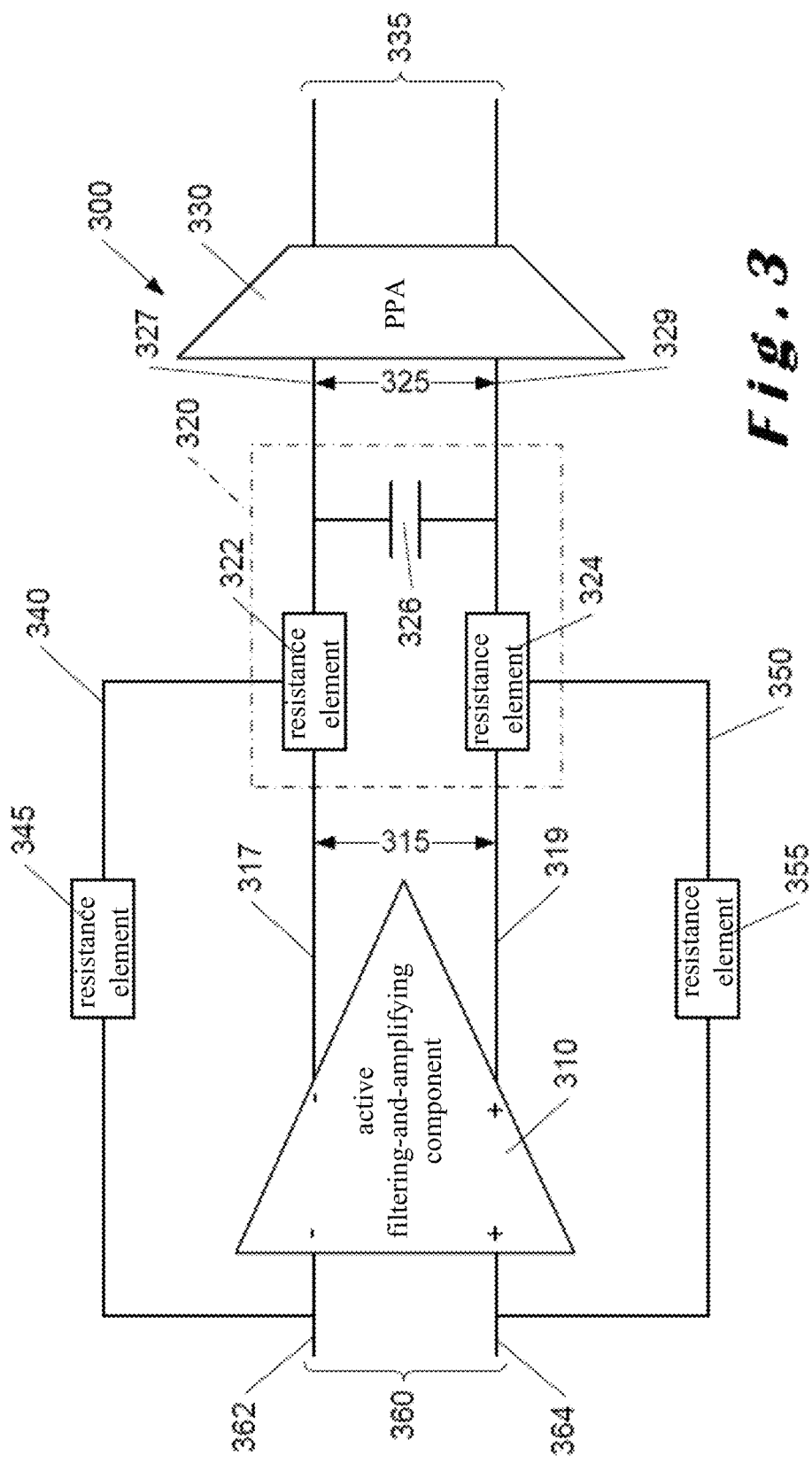
FIG. 3 illustrates a block diagram of a transmitter circuit, in accordance with an embodiment.

FIG. 3 illustrates a block diagram of a transmitter circuit 300, in accordance with an embodiment. The circuit 300 comprises an active filtering-and-amplifying component 310 connected to a passive filter component 320. The passive filter component 320 is connected to a PPA 330 and to the active filtering-and-amplifying component 310 by two feedback loops 340, 350. Output signal 335 from the PPA 330 is passed to a front end (not shown) for transmission.

Input signal 360, shown as negative line 362 and positive line 364, from a DAC (not shown) is input to the positive and negative terminals of the active filtering-and-amplifying component 310. An output signal 315, shown as negative line 317 and positive line 319, from the active filtering-and-amplifying component 310 is input to the passive filter component 320 as shown. An output signal 325, shown as negative line 327 and positive line 329, from the passive filter component 320 is passed to a PPA 330 as shown.

Whilst the transmitter circuit shown in FIG. 3 is a differential circuit, it will readily be appreciated that the present disclosure can also be used with a single-ended circuit. In this case, a single feedback loop will be provided from the single output of the passive filter component to the single input of the active filtering-and-amplifying component.

The passive filter component 320 comprises two resistance elements 322, 324 and a capacitance element 326 connected across the two resistance elements 322, 324 as shown. Each line 317, 319 of output signal 315 provided by active filtering-and-amplifying component 310 is connected to a respective one of the resistance elements 322, 324.

Feedback loop 340 comprises a tap from the resistance element 322 that is fed back to the negative line 362 of input signal 360. Feedback loop 340 also includes a resistance element 345. Similarly, feedback loop 350 comprises a tap from the resistance element 324 that is fed back to the positive line 364 of input signal 360 and includes a resistance element 355. Here, each resistance element 322, 324 effectively comprises a switch element and a resistor element and the tap is taken between the switch element and the resistor element. This is illustrated in more detail below in connection with FIG. 5.

Elements 322, 324, 345 and 355, although described as resistance elements, may take any suitable form to provide the function of the passive pole arrangement and the feedback loops and may include at least one switch element (not shown).

The passive filter component 320 is arranged for suppressing noise in the baseband signal 360 where the feedback loops 340, 350 remove or reduce the non-linearity of the variable resistance elements 322, 324.

It will be appreciated that FIG. 3 is simplified for ease of explanation by referring to a single baseband signal. However, it will readily be understood that a similar configuration can be provided for each baseband signal if an I-Q arrangement is implemented. Moreover, a multi-standard transmitter is a multi-mode and multi-band transmitter in which a signal path can be reused for different modes and bands. In accordance with the present disclosure, a (multi-standard) transmitter architecture can be provided without performance degradation and which has the ability to trade-off mixer gain losses for out-of-band noise where necessary.

Figure 4:
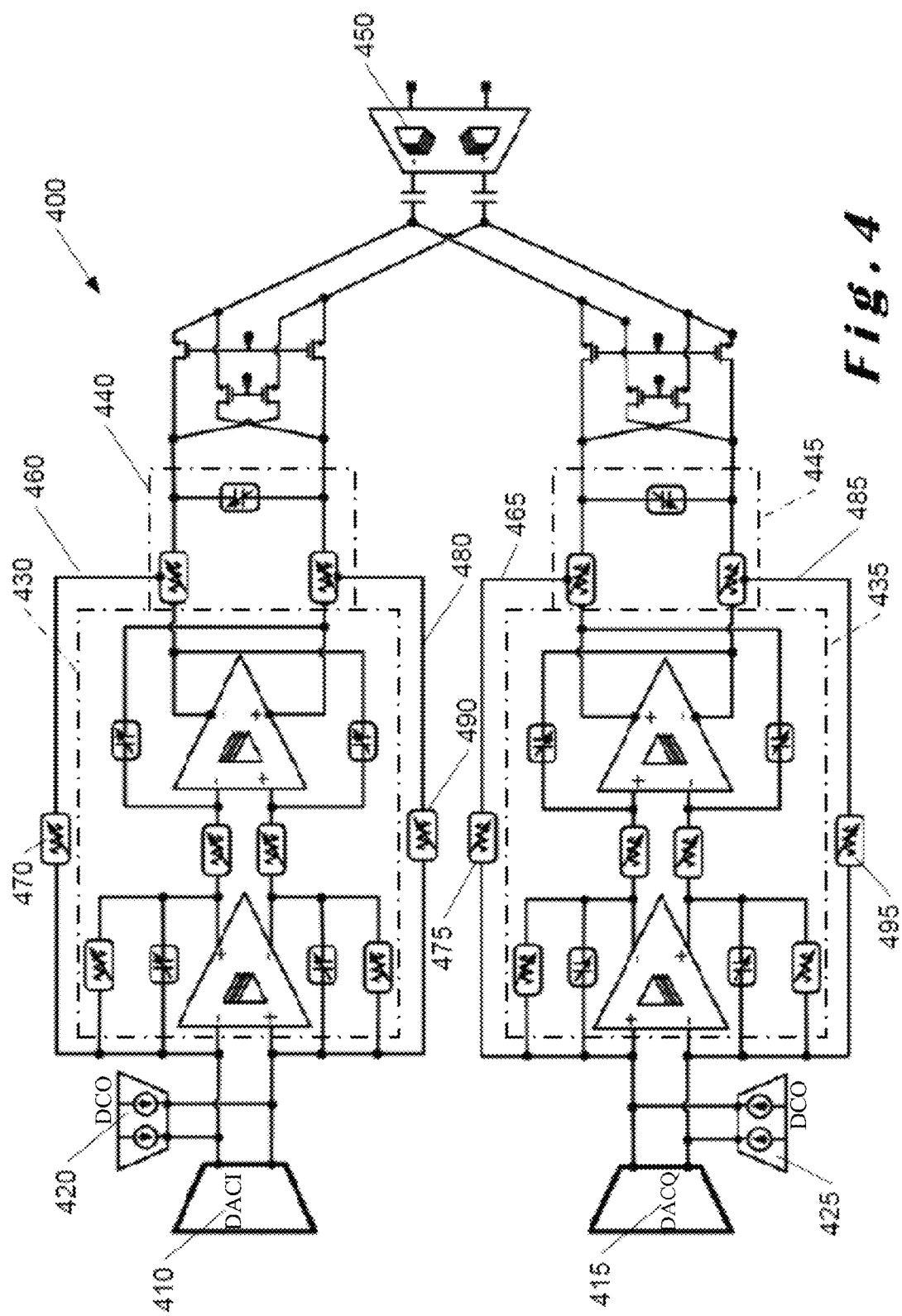
FIG. 4 illustrates a block diagram of an example transmitter, in accordance with an embodiment.

FIG. 4 illustrates a block diagram of an example transmitter 400, in accordance with an embodiment. As shown in FIG. 4, resistance elements in the feedback loop are switchable, making the architecture more flexible. As shown, the switches are in the feedback loop of the previous active filtering stage.

For each baseband channel, the transmitter 400 comprises DACI 410 and DACQ 415; digitally-controlled oscillators (DCO) 420, 425; active filtering-and-amplifying components 430, 435; passive filter components 440, 445; PPA 450; and feedback loops 460, 465, 480, 485 with their switchable resistance elements 470, 475, 490, 495, respectively. Although described in terms of baseband channels, it will be appreciated that it can be the signal or signal component in the I-Q situation that passes through the components listed above.

In the transmitter of FIG. 4, it is possible to solve the problem of carrier-to-noise (CNR) in frequency division duplexing (FDD) for long term evolution (LTE) transmitters that have, for example, 15 bands and 6 bandwidths. This offers a number of advantages.

For one, the non-linearity in the resistance of the resistance pole (RP) switches is now divided by the open-loop gain of the feedback based active filter, making their contribution to the output distortion negligible.

Further, any RP value can be selected. This allows trade-offs that would require a large RP value, such as when very close receiver offsets are desired (e.g., 30 MHz and 48 MHz). This also allows trade-offs that would require a small RP value, such as when wide channel bandwidth and high radio frequency (RF) are desired. In practice, the RP values are limited to a predetermined number of combinations in order to minimise the complexity of the system.

Still further, the active filter operational amplifier noise specifications can be relaxed. Additionally, power consumption as out-of-band noise can be effectively and efficiently filtered in each band/bandwidth setting.

Figure 5:
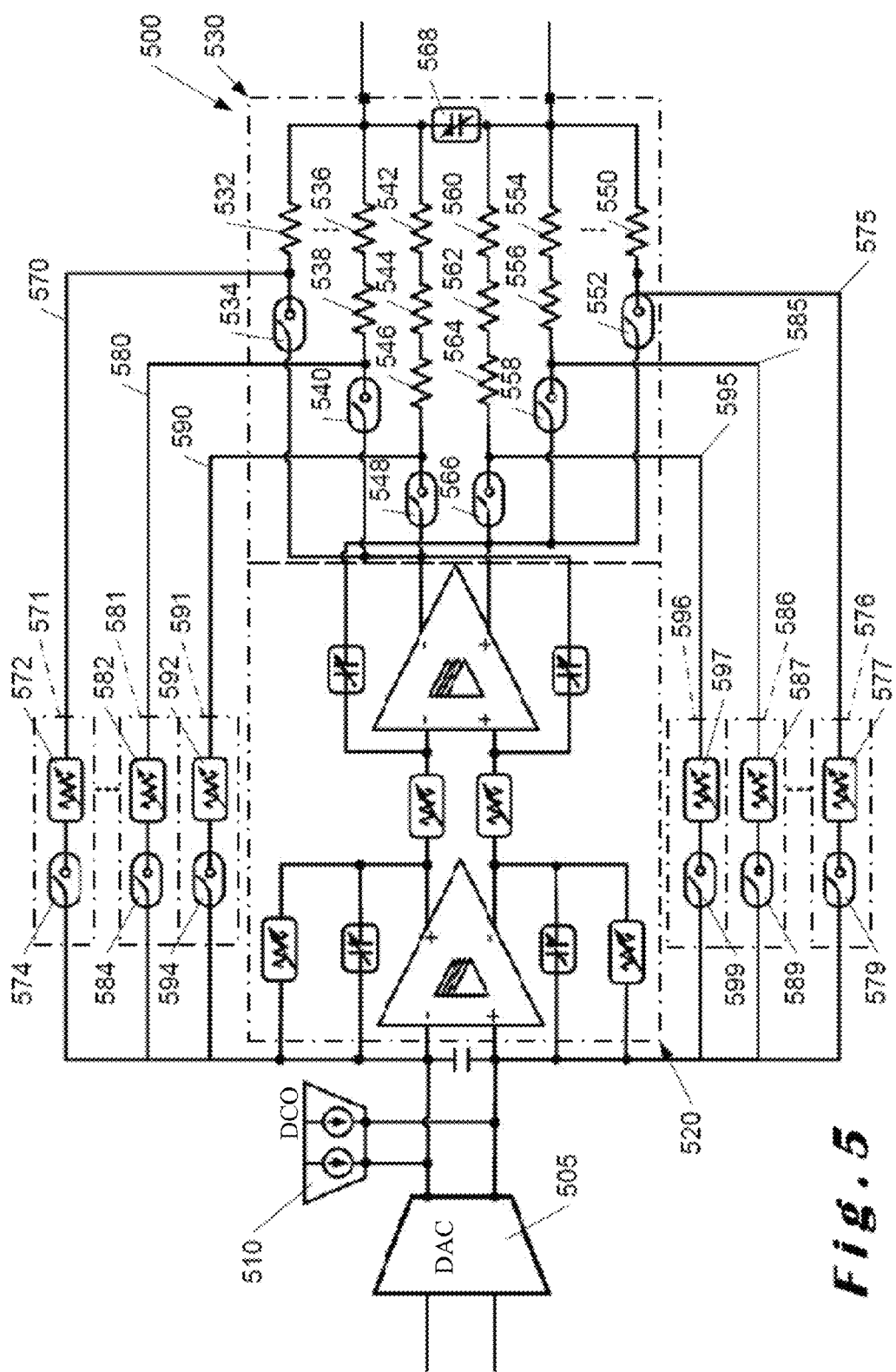
FIG. 5 illustrates a block diagram of another example transmitter, in accordance with an embodiment.

FIG. 5 illustrates a block diagram of another example transmitter, in accordance with an embodiment. While in FIG. 5 a single baseband channel 500 is shown for clarity, it will be appreciated that, in some embodiments, the transmitter may include two of these channels 500, one for the I channel and one for the Q channel. As mentioned above, these channels may be signals or signal components.

As shown, the baseband channel 500 comprises a DAC 505; a digitally-controlled oscillator (DCO) 510; an active filtering-and-amplifying component 520 shown as a dotted block containing filtering and/or amplifying elements; a passive filter component 530; and feedback loops 570, 575, 580, 585, 590, 595.

In FIG. 5, the passive filter component 530 comprises a plurality of resistance elements that are configurable to receive the output from the active filtering-and-amplifying component 520 by means of switch elements. Although only three rows of resistance elements and their associated switch elements are shown for each of the lines forming the output of the active filtering-and-amplifying component 520, it will be appreciated that any number of rows of resistance elements and their associated switch elements can be provided in accordance with the particular application. Here, each row of resistance elements and their associated switch elements corresponds to a particular frequency band.

As shown, for the negative line output from the active filtering-and-amplifying component 520, there is a resistance element 532 associated with a switch element 534; a pair of resistance elements 536, 538 connected in series associated with a switch element 540; and three resistance elements 542, 544, 546 connected in series associated with a switch element 548. Similarly, for the positive line output from the active filtering-and-amplifying component 520, there is a resistance element 550 associated with a switch element 552; a pair of resistance elements 554, 556 connected in series associated with a switch element 558; and three resistance elements 560, 562, 564 connected in series associated with a switch element 566. As before, a capacitance element 568 is connected across the resistance elements as shown, and forms a variable passive pole arrangement. The passive pole arrangement varies according to which switches are closed.

Each switch and associated resistance element or elements can be considered to be a resistance pole, and together, each switch and associated resistance element or elements can be considered to form part of a resistance pole array.

Turning now to the feedback loops, each feedback loop 570, 575, 580, 585, 590, 595 includes a switchable resistance element 571, 576, 581, 586, 591, 596. As shown, each switchable resistance element 571, 576, 581, 586, 591, 596 comprises a respective resistance element 572, 577, 582, 587, 592, 597 and switch element 574, 579, 584, 589, 594, 599.

In operation, the switch elements 534, 540, 548, 552, 558, 566 in the passive filter component 530 are closed to activate their associated resistance elements. Similarly, the switch elements 574, 579, 584, 589, 594, 599 in the switchable resistance elements 571, 576, 581, 586, 591, 596 in the feedback loops 570, 575, 580, 585, 590, 595 are also closed to activate their associated resistance elements 572, 577, 582, 587, 592, 597.

In the arrangement shown, pairs of switch elements in the passive filter component 530 operate with pairs of switch elements in the feedback loops. For example, switch elements 534 and 552 in the passive filter component 530 operate with switch elements 574 and 579 in respective feedback loops 570 and 575. Similarly, switch elements 540 and 558 operate with switch elements 584 and 589 and switch elements 548 and 566 operate with switch elements 594 and 599. This is described in more detail below in connection with FIGS. 6 and 7.

Figure 6:
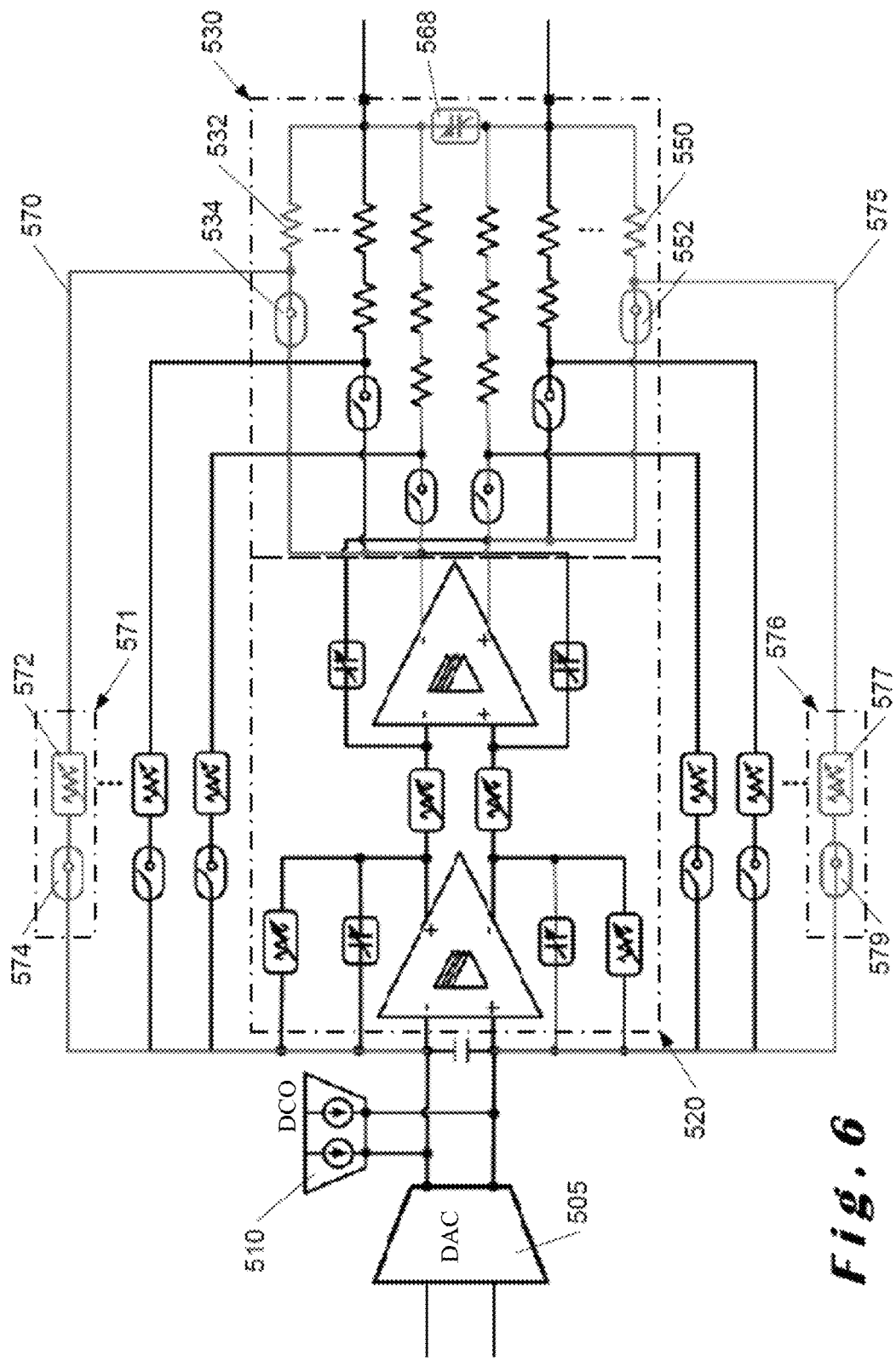
FIG. 6 illustrates an example switching arrangement, in accordance with an embodiment.
Figure 7:
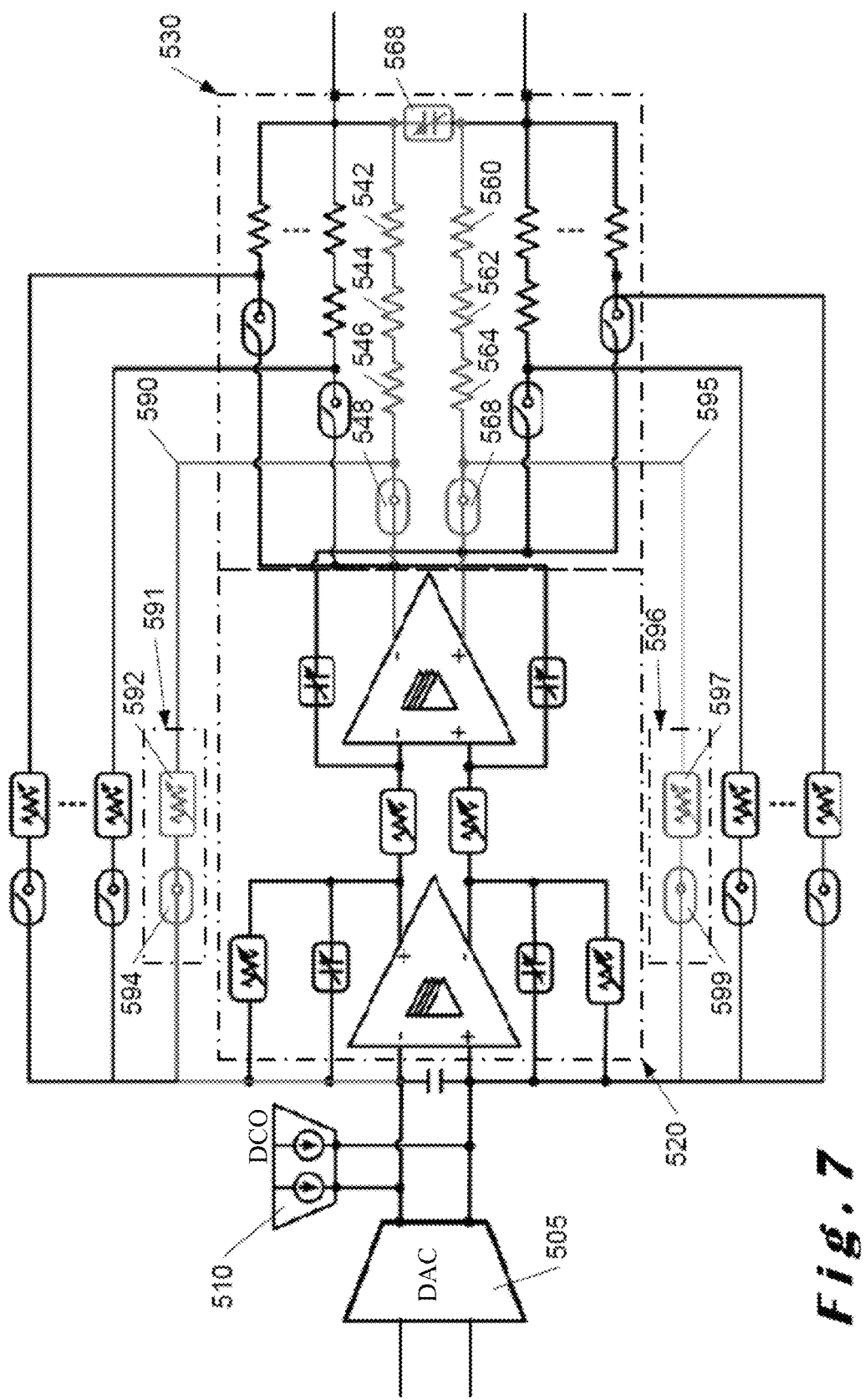
FIG. 7 illustrates another example switching arrangement, in accordance with an embodiment.

FIGS. 6 and 7 illustrate example switching arrangements, in accordance with embodiments. In each of FIGS. 6 and 7, components that have been described with reference to FIG. 5 above have the same reference numerals.

In FIG. 6, a pair of resistance poles, each having a single resistance element, is selected in the passive filter component 530. Switch elements 534 and 552 associated with respective resistance poles are closed to create an active circuit that includes resistance element 532 to form one resistance pole and resistance element 550 to form the other resistance pole. Capacitance element 568 completes the active passive filtering circuit. The associated feedback loops 570, 575 are also activated by closure of switch elements 574 and 579.

Similarly, in FIG. 7, a pair of resistance poles, each having three resistance elements, is selected in the passive filter component 530. Switch elements 548 and 568 are closed to create an active circuit that includes resistance elements 542, 544, 546 to form one resistance pole and resistance elements 560, 562, 564 to form the other resistance pole. Capacitance element 568 completes the active passive filtering circuit. The associated feedback loops 590, 595 are also activated by the closure of switch elements 594 and 599.

Whilst the resistance elements in the passive filter component 530 are shown as single resistors, it will be appreciated that they may comprise multiple resistors connected to provide any desired resistance value.

In an example of the present disclosure, a complete transmitter chain can be provided that covers all 17 LTE bands and beyond, resulting in a highly efficient and flexible transmitter. Such a transmitter may achieve CNR down to, for example, −162 dBc/Hz for channel bandwidths up to, for example, 20 MHz in most LTE/FDD bands, including band XI (1.4 GHz carrier/48 MHz transmitter-receiver distance), band XII (0.7 GHz/30 MHz) and band VII (2.5 GHz/120 MHz), without the aid of external inter-stage acoustic filters. Furthermore, the same transmitter may be used in legacy WCDMA FDD scenarios and can be used with other bands/modulations such as Gaussian Minimum Shift Keying (GMSK) and Orthogonal Frequency Division Multiplexing (OFDM)-based standards up to 5.5 GHz carrier frequency.

The transmitter may use a flexible $3^{rd}$ order trans-impedance low-pass filter (TILPF) to remove DAC aliases and out-of-band quantisation noise. In this case, the TILPF may be followed by a passive mixer which up-converts the baseband voltage onto the pre-power amplifier's (PPA) input capacitor. To ease the interfacing with different power amplifiers, two on-chip baluns centred around 1 GHz and 2 GHz may be integrated within the transmitter, and a wideband differential output may extend the transmission frequency range.

The TILPF may be based on a flexible Tow-Thomas topology that offers independent programming of trans-impedance gain and bandwidth.

Filtering and mixing stages may be designed to limit the impact on CNR while keeping the power consumption minimal over the desired RF range. At baseband, in order to achieve out-of-band noise lower than −180 dBV/Hz with limited power consumption, an additional passive filtering stage may be added after the TILPF.

In the example above, good CNR and sufficient output power over different bands can be achieved with a tuneable passive pole arrangement, as described above. However, special care must be taken in selecting the right RP value which finally determines the losses of the passive mixer and therefore the transmitter maximum frequency range. Low cut-offs and big RP values are an option when the selected band foresees transmission-reception frequency offset lower than 48 MHz at lower RF frequencies. On the other hand, RP values should be as small as possible when wide channel bandwidth and high RF frequency are required.

As described above with reference to FIGS. 6 and 7, the switches of the RP array are closed inside a multi-feedback loop generated from the previous filtering stage. When a switch in the passive filter component, that is, a passive switch, is ON to activate a certain resistance element, a correspondent feedback loop is selected through a feedback switch. The non-linear resistance of the active passive switch is thus divided by the open loop gain of the TILPF, making its contribution to the distortion negligible. Overall, the passive pole bandwidth can vary from about 7 MHz to 50 MHz without sacrificing linearity. In order to efficiently drive resistance element values as low as 40Ω, a class-AB low-voltage op-amp topology is implemented that can trade power consumption for linearity where needed.

A PPA may consist of a cascoded differential Common Source amplifier loaded with two on-chip baluns with programmable centre frequency. A differential wide-band output may be provided to extend the frequency range. The amplifier transistor may be split in binary scaled units that can be turned on or off by thick-oxide cascode transistors. At the low end, additional gain steps are obtained by dumping the cascode output current either to the correct output or the power supply. Overall, the PPA gain range is 60 dB achieved in eleven coarse steps of 6 dB. Fine tuning is also available to achieve less than 1 dB gain control.

A comparison with state-of-the-art SAW-less cellular transmitters is shown in Table 1 below for WCDMA band1. This table demonstrates that a transmitter in accordance with the present disclosure, although very flexible, performs comparably with typical SAW-less transmitters.

TABLE 1

|  | 'A' | 'B' | 'C' | 'D' | 'E' | 'F' |
|---|---|---|---|---|---|---|
| CMOS [NM] | 180 | 180 | 65 | 45 | 90 | 40 |
| AREA [MM²] | 5 | 4.5 | 0.2 | 0.8 | N.R. | 0.98 |
| POUT [DBM] | +5 | +3.8 | +3.3 | +1 | +2 | +3.79 |
| ACLR [DB] | −42.6 | −46 | −44 | −49 | −50 | −40.6 |
| CNR [DBC/HZ] | 160-3* | −158 | −160 | −158 | −159.8 | −161 |
| DELTA [MHz] | 190 | 40 | 80 | 240 | 190 | 40 |
| EVM [%] | 4.7% | 3.7% | 4.5% | 2% | 2% | 2% |

TABLE 1-continued

|  | 'A' | 'B' | 'C' | 'D' | 'E' | 'F' |
|---|---|---|---|---|---|---|
| PDC [MW] | 72-118 | 75-210 | 65 (NO PLL) | 27 (NO PLL) | 158-342 (@ BATTERY) | 23-125 (NO PLL) |

In Table 1, 'F' refers to a transmitter arrangement in accordance with the present invention. The others refer to a number of typical transmitter arrangements.

In particular, 'A' refers to M. Cassia et al. in "A Low-Power CMOS SAW-Less Quad Band WCDMA/HSPA/HSPA+/1X/EGPRS Transmitter", IEEE. J. Solid-State Circuits, vol. 44, no. 7, pp 1897-1906, July 2009.

Further, 'B' refers to C Jones et al. in "Direct-Conversion WCDMA Transmitter with 163 dBc/Hz Noise at 190 MHz Offset", ISSCC Dig. Tech. Papers, pp. 336-607, February 2007.

Still further, 'C' refers to A. Mirzaei and H. Darabi in "A Low-Power WCDMA Transmitter with an Integrated Notch Filter", IEEE J. Solid-State Circuits, vol. 43, no. 12, pp. 2868-2881, December 2008.

Still further, 'D' refers to Xin He, Jan van Sinderen and Robert Rutten, entitled "A 45 nm WCDMA Transmitter Using Direct Quadrature Voltage Modulator with High Oversampling Digital Front-End", ISSCC Dig. of Tech. Papers, pp. 62-63, February 2010.

Lastly, 'E' refers to K Hausmann et al., "A SAW-less CMOS TX for EGPRS and WCDMA", IEEE Radio Frequency Integrated Circuits Symposium (RFIC), pp. 25-28, May 2010, in which a 90 nm CMOS TX path architected for operation without inter-stage SAW filters is described in which the SAW elimination strategy is purely low noise design but the architecture still achieves DG.09 weighted TX current drain of 50 mA from the battery. The combination of a passive interleaved switching mixer plus digital gain control allows 2% EVM at 2 dBm and 4.2% at −78 dBm.

What is claimed is:

1. A transmitter circuit comprising:
   an active filtering-and-amplifying component comprising:
     a first input configured to receive a first input signal, and
     a first output configured to output a first output signal;
   a passive filtering component comprising:
     a second input connected to the first output and configured to receive the first output signal,
     a passive pole arrangement comprising a number of switchable resistance elements and a capacitance element connected across the switchable resistance elements, and
     a second output configured to output a second output signal having reduced noise as compared to the first output signal; and
   a number of feedback loops connecting the passive filtering component to the first input.

2. The transmitter circuit of claim 1, wherein each switchable resistance element comprises a switch element and at least one resistance element.

3. The transmitter circuit of claim 1, wherein the plurality of switchable resistance elements are connected in parallel.

4. The transmitter circuit of claim 1, wherein each feedback loop comprises a feedback loop resistance element.

5. The transmitter circuit of claim 4, wherein the feedback loop resistance element comprises a switch element and at least one resistance element.

6. The transmitter circuit of claim 1, wherein the number of switchable resistance elements is equal to the number of feedback loops.

7. The transmitter circuit of claim 6, wherein each feedback loop is connected to a single switchable resistance element.

8. The transmitter circuit of claim 1, further comprising a control component configured to select a pair of resistive switching elements in the passive pole arrangement.

9. The transmitter circuit of claim 8, wherein the control component is further configured to close the switches in the selected pair of resistive switching elements.

10. The transmitter circuit of claim 1, further comprising:
a digital-to-analogue converter; and
a digitally-controlled oscillator, each of which is connected to the first input.

11. The transmitter circuit of claim 1, wherein:
the first input signal comprises a baseband signal, and
the first output signal comprises a first filtered baseband signal.

12. The transmitter circuit of claim 11, wherein:
the second output signal comprises a second filtered baseband signal.

13. The transmitter circuit of claim 12, further comprising a mixer configured to up-convert the second filtered baseband signal to a radio frequency signal.

14. A transceiver comprising:
a number of transmitter circuits, each transmitter circuit comprising:
an active filtering-and-amplifying component comprising:
a first input configured to receive a first input signal, and
a first output configured to output a first output signal;
a passive filtering component comprising:
a second input connected to the first output and configured to receive the first output signal,
a passive pole arrangement comprising a number of switchable resistance elements and a capacitance element connected across the switchable resistance elements, and
a second output configured to output a second output signal having reduced noise as compared to the first output signal; and
a number of feedback loops connecting the passive filtering component to the first input.

15. The transceiver of claim 14, further comprising a pre-power amplifier connected to each of the transmitter circuits.

16. The transceiver of claim 14, wherein each transmitter circuit further comprises:
a digital-to-analogue converter; and
a digitally-controlled oscillator, each of which is connected to the first input.

17. The transceiver of claim 14, wherein:
the first input signal comprises a baseband signal,
the first output signal comprises a first filtered baseband signal, and
the second output signal comprises a second filtered baseband signal.

18. The transceiver of claim 17, wherein each transmitter circuit further comprises a mixer configured to up-convert the second filtered baseband signal to a radio frequency signal.

19. An integrated circuit comprising:
a transceiver comprising:
a number of transmitter circuits, each transmitter circuit comprising:
an active filtering-and-amplifying component comprising:
a first input configured to receive a first input signal, and
a first output configured to output a first output signal;
a passive filtering component comprising:
a second input connected to the first output and configured to receive the first output signal,
a passive pole arrangement comprising a number of switchable resistance elements and a capacitance element connected across the switchable resistance elements, and
a second output configured to output a second output signal having reduced noise as compared to the first output signal; and
a number of feedback loops connecting the passive filtering component to the first input.

20. The integrated circuit of claim 19, wherein the transceiver is implemented in complementary metal-oxide-semiconductor technology.

* * * * *